US012581687B2

(12) United States Patent
Hu et al.

(10) Patent No.: US 12,581,687 B2
(45) Date of Patent: Mar. 17, 2026

(54) ARRAY SUBSTRATE, METHOD OF MANUFACTURING THE SAME, AND DISPLAY PANEL

(71) Applicant: TCL China Star Optoelectronics Technology Co., Ltd., Shenzhen (CN)

(72) Inventors: Liang Hu, Shenzhen (CN); Bin Liu, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 588 days.

(21) Appl. No.: 17/876,578

(22) Filed: Jul. 29, 2022

(65) Prior Publication Data

US 2023/0411528 A1 Dec. 21, 2023

(30) Foreign Application Priority Data

Jun. 21, 2022 (CN) .......................... 202210707512.6

(51) Int. Cl.
*H10D 30/67* (2025.01)
*H10D 30/01* (2025.01)

(52) U.S. Cl.
CPC ....... *H10D 30/6723* (2025.01); *H10D 30/031* (2025.01); *H10D 30/6755* (2025.01)

(58) Field of Classification Search
CPC ...... H10H 29/30; H10K 59/12; H10K 59/126; H10D 30/6723; H01L 29/78633; H01L 29/7869; H01L 29/66742; H01L 27/1225; H01L 27/1244; H01L 27/1259
See application file for complete search history.

(56) References Cited

FOREIGN PATENT DOCUMENTS

| CN | 111739922 A | * | 10/2020 | ......... | H01L 27/3246 |
| CN | 112701129 A | * | 4/2021 | ........... | H01L 27/124 |
| WO | WO-2020238892 A1 | * | 12/2020 | ......... | H01L 27/3232 |

OTHER PUBLICATIONS

Choi_English, choi translation (Year: 2020).*
Liu_English, liu translation (Year: 2021).*
Chen_English1, chen translation (Year: 2020).*

* cited by examiner

*Primary Examiner* — Minsun O Harvey
*Assistant Examiner* — Alexander Ehrlich

(57) ABSTRACT

An array substrate, a method of manufacturing the same, and a display panel are provided. The array substrate includes a substrate, a conductive thin film layer, a first light-shielding layer, a second light-shielding layer, a third light-shielding layer, and an array device layer, wherein orthographic projection areas of the first light-shielding layer and second light-shielding layer on the substrate are positioned in an orthographic projection area of the conductive thin film layer on the substrate, wherein a pixel unit of the array device layer includes a first thin film transistor, a second thin film transistor, and a third thin film transistor. The first light-shielding layer is positioned between the substrate and the first thin film transistor, the second light-shielding layer is positioned between the substrate and the second thin film transistor, and the third light-shielding layer is positioned between the substrate and the third thin film transistor.

20 Claims, 5 Drawing Sheets

100

100

200

250

280

270

220

210

230      260      240

200

250

280

270

220

210

230      50      240

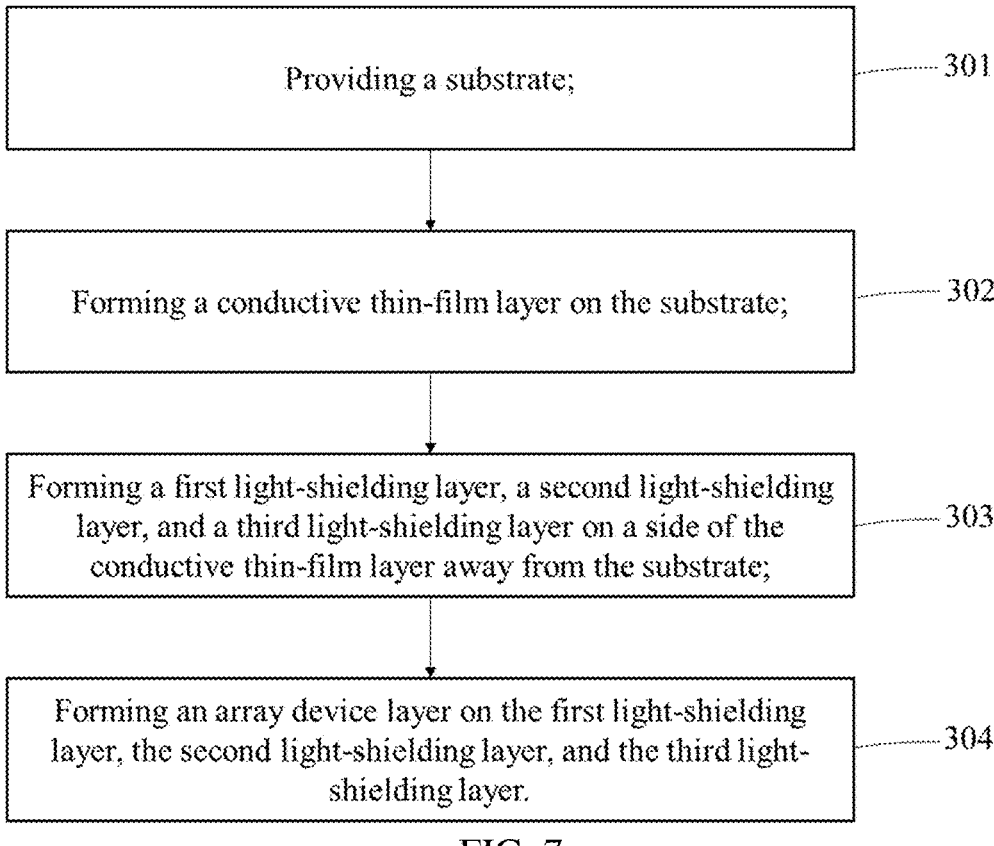

Providing a substrate; ———— 301

Forming a conductive thin-film layer on the substrate; ———— 302

Forming a first light-shielding layer, a second light-shielding layer, and a third light-shielding layer on a side of the conductive thin-film layer away from the substrate; ———— 303

Forming an array device layer on the first light-shielding layer, the second light-shielding layer, and the third light-shielding layer. ———— 304

FIG. 7

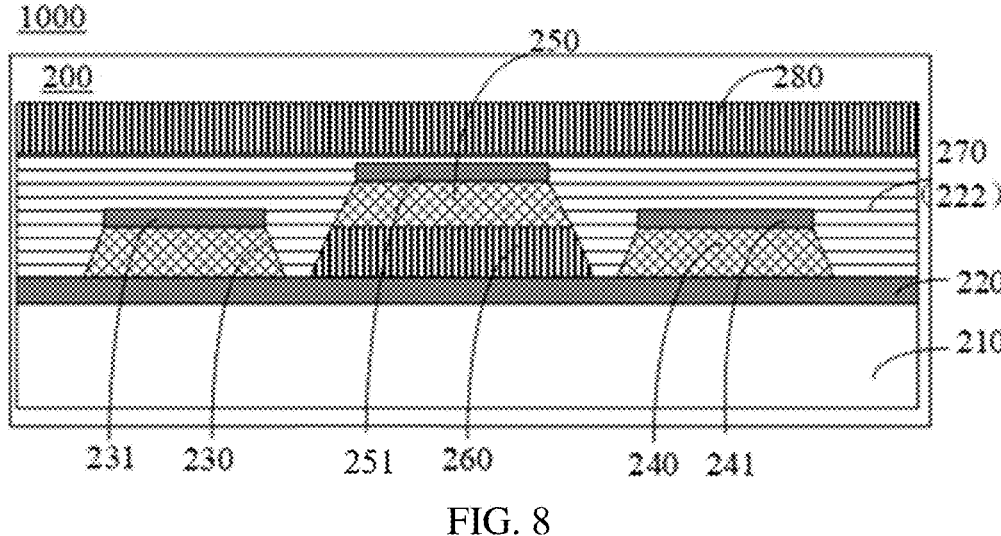

FIG. 8

ARRAY SUBSTRATE, METHOD OF MANUFACTURING THE SAME, AND DISPLAY PANEL

RELATED APPLICATION

This application claims the benefit of priority of China Patent Application No. 202210707512.6 filed on Jun. 21, 2022, the contents of which are incorporated by reference as if fully set forth herein in their entirety.

FIELD OF INVENTION

The present application relates to a field of display technology and particularly relates to an array substrate, a method of manufacturing the same, and a display panel.

BACKGROUND OF INVENTION

Light irradiation affects the stability of oxide semiconductor thin film transistors in a display panel. In order to solve this problem, in a conventional technical solution, a light-shielding layer is usually added at a bottom of the oxide semiconductor thin film transistor to prevent the oxide semiconductor thin film transistor from being irradiated by light. This improves the stability of the oxide semiconductor thin film transistor.

Technical Problem

A pixel unit in the display panel with driving architecture of 3T1C includes three thin film transistors. In the traditional technical solution, light-shielding layers are usually added under the three thin film transistors for shielding light. Among the three thin film transistors, the light-shielding layers corresponding to the other two thin-film transistors except the driving thin-film transistor are directly connected by metal wirings, and are led out through metal wirings on the same layer as the light-shielding layer, and applied to a given potential. Although this method prevents the threshold voltage shift between the two thin film transistors, the metal wiring between the two is easily short-circuited with other signal wirings.

SUMMARY OF INVENTION

Embodiments of the present application provide an array substrate, a manufacturing method thereof, and a display panel, which avoid short circuits between metal wirings connecting the first light-shielding layer and the second light-shielding layer and other metal wirings.

In a first aspect, an embodiment of the present application provides an array substrate, including: a substrate; a conductive thin film layer disposed on the substrate; a first light-shielding layer, a second light-shielding layer, and a third light-shielding layer, wherein the first light-shielding layer, the second light-shielding layer, and the third light-shielding layer are disposed on a side of the conductive film layer away from the substrate, wherein an orthographic projection area of the first light-shielding layer and an orthographic projection area of the second light-shielding layer on the substrate are positioned in an orthographic projection area of the conductive thin film layer on the substrate, and wherein the first light-shielding layer and the second light-shielding layer include conductor materials; and an array device layer, wherein a pixel unit of the array device layer includes a first thin film transistor, a second thin film transistor, and a third thin film transistor, and wherein the first light-shielding layer is positioned between the substrate and the first thin film transistor, the second light-shielding layer is positioned between the substrate and the second thin film transistor, and the third light-shielding layer is positioned between the substrate and the third thin film transistor.

Optionally, in some embodiments, the array substrate further includes a first planarization layer arranged between the conductive thin film layer and the third light-shielding layer, wherein an orthographic projection area of the third light-shielding layer on the substrate is positioned in an orthographic projection area of the first planarization layer on the substrate.

Optionally, in some embodiments, the first planarization layer is arranged on the same layer as the first light-shielding layer and the second light-shielding layer on the conductive film layer, and wherein a sum of the orthographic projection area of the first light-shielding layer, the orthographic projection area of the second light-shielding layer, and the orthographic projection area of the first planarization layer on the substrate is less than or equal to the orthographic projection area of the conductive thin film layer on the substrate.

Optionally, in some embodiments, a groove is defined on a side of the conductive thin film layer away from the substrate, and wherein an orthographic projection area of the third light-shielding layer on the substrate is positioned in an orthographic projection area of the groove on the substrate.

Optionally, in some embodiments, the depth of the groove is less than the thickness of the conductive thin film layer.

Optionally, in some embodiments, the conductive thin film layer is connected to a common voltage input terminal positioned in a peripheral region of the array substrate.

Optionally, in some embodiments, the material of the conductive thin film layer includes indium tin oxide.

Optionally, in some embodiments, the base substrate further includes a gate insulating layer and a second planarization layer, wherein the gate insulating layer is disposed on the conductive thin film layer, the gate insulating layer covers the first light-shielding layer, the second light-shielding layer, the third light-shielding layer, and the first planarization layer, and the second planarization is disposed on the gate insulating layer.

In a second aspect, an embodiment of the present application further provides a method of manufacturing an array substrate, including: providing a substrate; forming a conductive thin film layer on the substrate; forming a first light-shielding layer, a second light-shielding layer, and a third light-shielding layer on a side of the conductive thin film layer away from the substrate, wherein an orthographic projection area of the first light-shielding layer and an orthographic projection area of the second light-shielding layer on the substrate are positioned in an orthographic projection area of the conductive thin film layer on the substrate, and wherein the first light-shielding layer and the second light-shielding layer include conductor materials; and forming an array device layer on the first light-shielding layer, the second light-shielding layer, and the third light-shielding layer, wherein a pixel unit of the array device layer includes a first thin film transistor, a second thin film transistor, and a third thin film transistor, and wherein the first light-shielding layer is positioned between the substrate and the first thin film transistor, the second light-shielding layer is positioned between the substrate and the second thin film transistor, and the third light-shielding layer is positioned between the substrate and the third thin film transistor.

Optionally, in some embodiments, the method further includes: forming a first planarization layer on the conductive thin film layer, wherein the first planarization layer is arranged between the conductive thin film layer and the third light-shielding layer, and wherein an orthographic projection area of the third light-shielding layer on the substrate is positioned in an orthographic projection area of the first planarization layer on the substrate.

Optionally, in some embodiments, after forming the first light-shielding layer, the second light-shielding layer, and the third light-shielding layer on the side of the conductive thin film layer away from the substrate, the method further includes: forming a gate insulating layer on the conductive thin film layer, wherein the gate insulating layer covers the first light-shielding layer, the second light-shielding layer, the third light-shielding layer, and the first planarization layer; and forming a second planarization layer on the gate insulating layer.

In a third aspect, an embodiment of the present application further provides a display panel, including the array substrate described in any one of the above.

Advantages

The array substrate provided in the embodiment of the present application includes: a substrate; a conductive thin film layer disposed on the substrate; a first light-shielding layer, a second light-shielding layer, and a third light-shielding layer, wherein the first light-shielding layer, the second light-shielding layer, and the third light-shielding layer are disposed on a side of the conductive film layer away from the substrate, wherein an orthographic projection area of the first light-shielding layer and an orthographic projection area of the second light-shielding layer on the substrate are positioned in an orthographic projection area of the conductive thin film layer on the substrate, and wherein the first light-shielding layer and the second light-shielding layer include conductor materials; and an array device layer, wherein a pixel unit of the array device layer includes a first thin film transistor, a second thin film transistor, and a third thin film transistor, and wherein the first light-shielding layer is positioned between the substrate and the first thin film transistor, the second light-shielding layer is positioned between the substrate and the second thin film transistor, and the third light-shielding layer is positioned between the substrate and the third thin film transistor. In this application, the first light-shielding layer and the second light-shielding layer are conductive materials, so the electrical connection between them can be realized through the conductive film layer to prevent the metal wiring connecting the first light-shielding layer and the second light-shielding layer from being short-circuited with other metal wirings.

DESCRIPTION OF DRAWINGS

FIG. 7 is a schematic flowchart of a method of manufacturing an array substrate provided by an embodiment of the present application.

FIG. 8 is a schematic diagram showing the display panel (1000) feature.

DETAILED DESCRIPTION OF PREFERRED EMBODIMENTS

The technical solutions in the embodiments of the present application will be clearly described with reference to the drawings in the embodiments of the present application. Obviously, the embodiments are only a part of the embodiments of the present application, but not all the embodiments. Based on these embodiments in the present application, all other embodiments obtained by one skill in the art without doing creative work fall within the protection scope of the present application.

Unless otherwise defined, technical or scientific terms used in this disclosure should have the ordinary meaning as understood by one of ordinary skill in the art. As used in this disclosure, "first", "second," and similar terms do not denote any order, quantity, or importance, but are merely used to distinguish the various components. Similarly, words such as "a," "an," or "the" do not denote a limitation of quantity, but rather denote the presence of at least one. "Comprises" or "include" and similar words mean that the elements or things appearing before the word encompass the elements or things recited after the word and their equivalents, but do not exclude other elements or things. Words like "connected" or "connected to each other" are not limited to physical or mechanical connections, but may include electrical connections, whether direct or indirect. Words like "above", "below", "left", "right", etc. are only used to indicate the relative positional relationship, and when the absolute position of the described object changes, the relative positional relationship may also change accordingly.

A pixel unit in a display panel with a driving architecture of 3T1C includes three thin film transistors. The traditional technical solution usually adds a light-shielding layer under the driving thin film transistor to shield the light, while the other two thin film transistors do not use the light-shielding layer to shield the light. If a light-shielding layer is added under the other two thin film transistors for light shielding, the potential of the added light-shielding layer needs to be considered.

Figure 1:
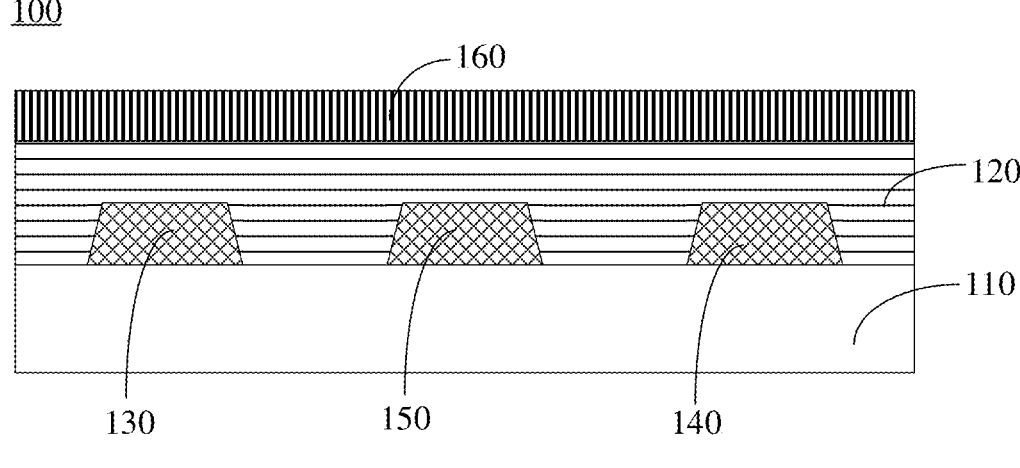
FIG. 1 is a schematic diagram of a first structure of an array substrate in a related art provided by an embodiment of the present application.
Figure 2:
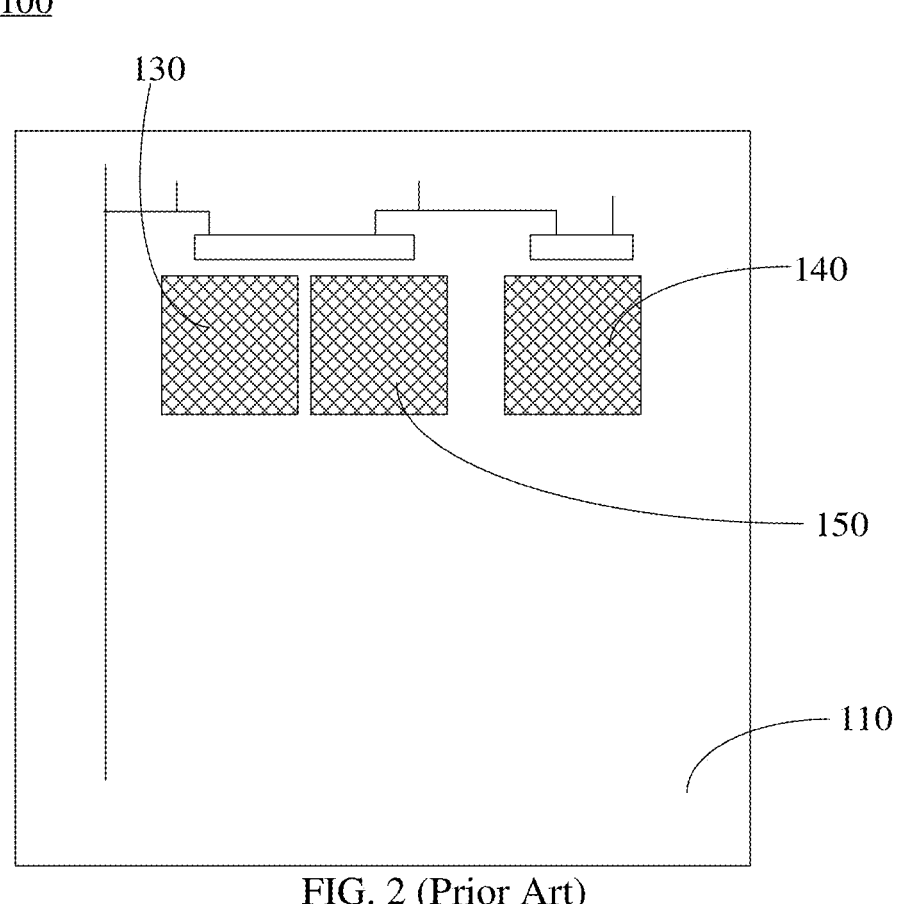
FIG. 2 is a schematic diagram of a second structure of an array substrate in a related art provided by an embodiment of the present application.

Please refer to FIG. 1 and FIG. 2. FIG. 1 is a schematic diagram of a first structure of an array substrate in a related art provided by an embodiment of the present application, and FIG. 2 is a schematic diagram of a second structure of an array substrate in a related art provided by an embodiment of the present application. The array substrate 100 may include a substrate 110, a gate insulating layer 120, a first light-shielding layer 130, a second light-shielding layer 140, a third light-shielding layer 150, and a planarization layer 160.

Wherein, a pixel unit in the 3T1C architecture display panel includes a first light-shielding layer 130, a second light-shielding layer 140, and a third light-shielding layer 150 under each of the three thin film transistors, respectively. That is, the first light-shielding layer 130, the second light-shielding layer 140, and the third light-shielding layer 150 respectively play a light-shielding role for the three thin film transistors in the pixel unit in the array substrate 100.

If the first light-shielding layer 130 and the second light-shielding layer 140 are connected to the source of the corresponding thin film transistor like the third light-shielding layer 150, the first light-shielding layer 130 and the second light-shielding layer 140 will be subjected to the gate pressure for a long time, and the threshold voltages between the corresponding two thin film transistors will be shifted, resulting in leakage during the light-emitting stage. In order to avoid the above situation, in the related art, the first light-shielding layer 130 and the second light-shielding layer 140 are electrically connected by metal wiring. The metal wiring is arranged in the same layer as the first light-shielding layer 130 and the second light-shielding layer 140, and the metal wiring is lead out through the first light-shielding layer 130 and the second light-shielding layer 140, and a given potential is applied to them. The signals externally connected to the first light-shielding layer 130 and the second light-shielding layer 140 can be controlled by the given potential.

However, the first light-shielding layer 130 and the second light-shielding layer 140 are also provided with metal wiring for controlling other signals, which causes the metal wiring connecting the first light-shielding layer 130 and the second light-shielding layer 140 to cross with other signal metal wiring, thereby easily causing a short circuit.

Figure 3:
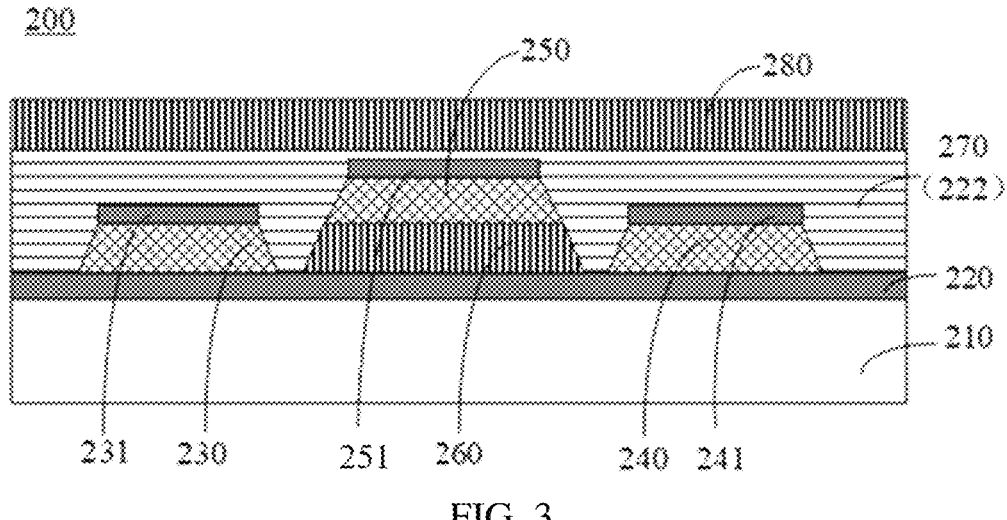
FIG. 3 is a schematic diagram of a first structure of an array substrate provided by an embodiment of the present application.
Figure 4:
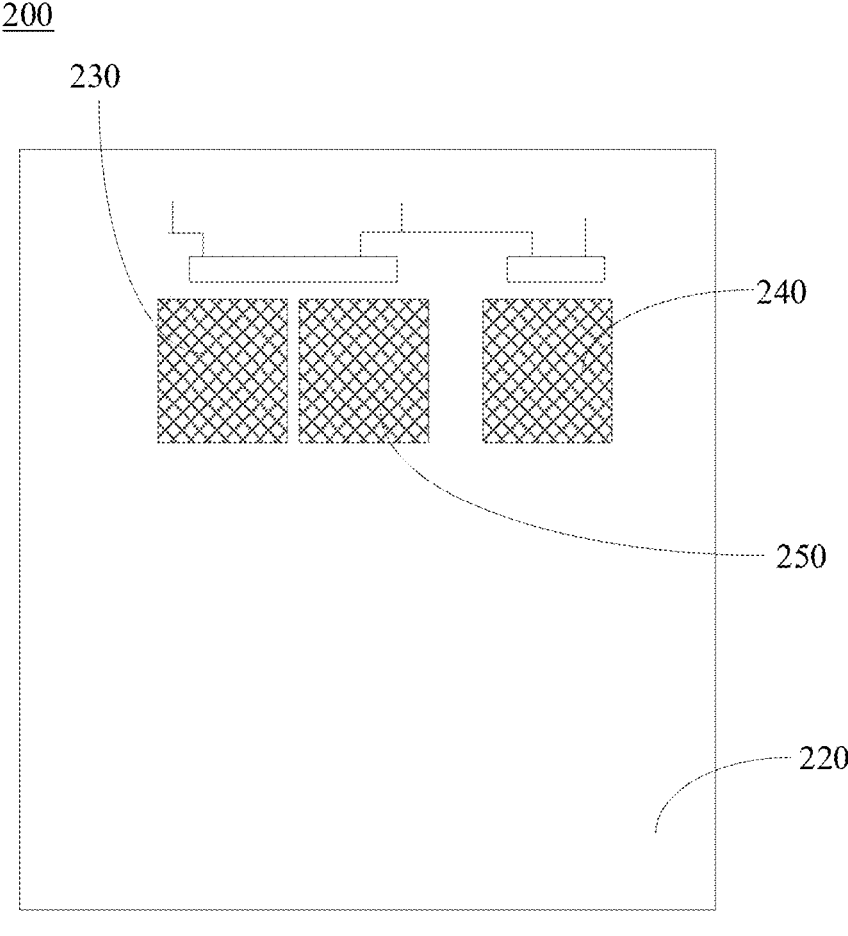
FIG. 4 is a schematic diagram of a second structure of an array substrate provided by an embodiment of the present application.

In order to solve the problems existing in the related art, the embodiments of the present application provide an array substrate, a method of manufacturing the array substrate, and a display panel. Please refer to FIG. 3 and FIG. 4, FIG. 3 is a schematic diagram of a first structure of an array substrate provided by an embodiment of the present application, and FIG. 4 is a schematic diagram of a second structure of an array substrate provided by an embodiment of the present application. The array substrate 200 may include a substrate 210, a conductive thin film layer 220, a first light-shielding layer 230, a second light-shielding layer 240, and a third light-shielding layer 250.

The substrate 210 may be a glass substrate or the like. The conductive thin film layer 220 may be disposed on the substrate 210. Specifically, the conductive thin film layer 220 may be integrally formed on substrate 210, that is, the area of the conductive thin film layer 220 is the same as that of the substrate 210. The conductive thin film layer 220 can be made of a conductive material, for example, the material of the conductive thin film layer 220 is indium tin oxide, etc. Therefore, the conductive thin film layer 220 can be served as a common electrode. The conductive thin film layer 220 can form an integral common electrode on the substrate 210, and the conductive thin film layer 220 can be connected to the common voltage input terminal located in the peripheral area of the array substrate 200 so that the conductive thin film layer 220 can obtain a common voltage.

The first light-shielding layer 230, the second light-shielding layer 240, and the third light-shielding layer 250 are all disposed on the side of the conductive thin film layer 220 away from the substrate 210. The first light-shielding layer 230 and the second light-shielding layer 240 are both conductor materials. The first light-shielding layer 230 and the second light-shielding layer 240 are both attached to the conductive film layer 220. The orthographic projection area of the first light-shielding layer 230 on the substrate 210 and the orthographic projection area of the second light-shielding layer 240 on the substrate 210 are positioned in the orthographic projection area of the conductive thin film layer 220 on the substrate 210. In addition, the first light-shielding layer 230 and the second light-shielding layer 240 are both conductive materials, so the first light-shielding layer 230 and the second light-shielding layer 240 are both electrically connected to the conductive film layer 220. Because the first light-shielding layer 230 and second light-shielding layer 240 are in direct contact with the conductive thin film layer 220, the electrical connection between the first light-shielding layer 230 and second light-shielding layer 240 and the conductive thin film layer 220 can be realized without arranging metal wirings between the first light-shielding layer 230 and second light-shielding layer 240 and the conductive thin film layer 220. Therefore, the electrical connection between the first light-shielding layer 230 and the second light-shielding layer 240 is realized through the conductive thin film layer 220.

The difference between the array substrate 200 provided in this embodiment and the array substrate 100 in the related art lies in: In this embodiment, the electrical connection between the first light-shielding layer 230 and the second light-shielding layer 240 is not realized by metal wiring, but the direct contact of the conductive film layer 220 is adopted to realize the connection between the first light-shielding layer 230 and the second light-shielding layer 240. Because the conductive thin film layer 220 is not in the same layer as the first light-shielding layer 230 and the second light-shielding layer 240, the metal wiring connecting the first light-shielding layer 230 and the second light-shielding layer 240 is prevented from intersecting with other signal metal wirings on the same layer to form a short circuit, thereby improving product quality.

It should be noted that the array substrate 200 includes an array device layer 222, and the array device layer 222 includes a plurality of pixel units, and each pixel unit may include three thin film transistors, namely a first thin film transistor 231, a second thin film transistor 241, and a third thin film transistor 251. In order to shield each thin film transistor from light, a light-shielding layer is correspondingly disposed under each thin film transistor. Specifically, the first thin film transistor 231 and the first light-shielding layer 230 are correspondingly disposed, and the first light-shielding layer 230 is positioned between the substrate 210 and the first thin film transistor 231, and the first light-shielding layer 230 shields the first thin film transistor 231 from light.

The second thin film transistor 241 and the second light-shielding layer 240 are disposed correspondingly, and the second light-shielding layer 240 is positioned between the substrate 210 and the second thin film transistor 241, and the second light- shielding layer 240 shields the second thin film transistor 241 from light. The third thin film transistor 251 and the third light-shielding layer 250 are disposed correspondingly, and the third light-shielding layer 250 is positioned between the substrate 210 and the third thin film transistor 251, and the third light-shielding layer 250 shields the third thin film transistor 251 from light.

It should be noted that the array device layer 222 of the array substrate 200 includes a plurality of pixel units, each pixel unit includes a first thin film transistor 231, a second thin film transistor 241, and a third thin film transistor 251. In order to shield the thin film transistors from light, a first light-shielding layer 230, a second light-shielding layer 240, and a third light-shielding layer 250 need to be respectively provided on the three thin film transistors of each pixel unit.

That is, a plurality of pixel units are correspondingly provided with a plurality of first light-shielding layers 230, a plurality of second light-shielding layers 240, and a plurality of third light-shielding layers 250, and a first light-shielding layer 230 and a second light-shielding layer 240 corresponding to a pixel unit are electrically connected through the conductive thin film layer 220.

In the array substrate provided by the prior art, a first light-shielding layer 130 and a second light-shielding layer 140 corresponding to a pixel unit in the array substrate 100 are led out and connected to external chips through metal wiring connected to the two, so that there will be multiple lead-out metal wiring for the connection between the two and multiple chips, thereby increasing the output signal of the array substrate 100. In this embodiment, the conductive thin film layer 220 is disposed on the substrate 210 with its entire surface so that it can be electrically connected to a plurality of external chips. The first light-shielding layers 230 and the second light-shielding layers 240 in the array substrate 200 are directly and electrically connected to the conductive thin film layer 220, so there is no need to lead out metal wiring from the first light-shielding layers 230 and the second light-shielding layers 240 to connect to the plurality of chips. By connecting them with the conductive thin film layer 220, the plurality of thin film transistors in the array substrate 200 can control the signals of the plurality of chips, thereby reducing the lead-out metal wiring, reducing the output signal, and improving the quality of the product.

The first light-shielding layer 230 and the second light-shielding layer 240 can be formed by the same process. Specifically, the first light-shielding layer 230 and the second light-shielding layer 240 corresponding to each pixel unit in the array substrate 200 can also be manufactured by the same process, thereby reducing the manufacturing process.

In addition, the array substrate 200 may further include a first planarization layer 260, and the first planarization layer 260 may be disposed on the conductive thin film layer 220. Specifically, the first planarization layer 260 may be disposed between the conductive thin film layer 220 and the third light-shielding layer 250, and the first planarization layer 260 is an insulating material. It should be noted that the third light-shielding layer 250 corresponds to the third thin film transistor, that is, the third light-shielding layer 250 shields the third thin film transistor from light. The third thin film transistor can be a driving thin film transistor, and the driving thin film transistor is used for connecting with the light-emitting device in the pixel unit to emit light. Therefore, the third light-shielding layer 250 needs to be connected to the source of the third thin film transistor to obtain a given voltage of the light-emitting device. Since the conductive thin film layer 220 has conductivity, if the third light-shielding layer 250 is in direct contact with the conductive thin film layer 220, and if the given voltage obtained by the third light-shielding layer 250 is the same as the common voltage obtained by the conductive thin film layer 220, a short circuit phenomenon is likely to occur.

In order to prevent the occurrence of a short circuit between the third light-shielding layer 250 and the conductive thin film layer 220, the orthographic projection area of the third light-shielding layer 250 on the substrate 210 is set to be positioned within the orthographic projection area of the first planarization layer 260 on the substrate 210. Therefore, the first planarization layer 260 with insulating properties can play the role of blocking the electrical connection between the third light-shielding layer 250 and the thin film layer 220.

Figures 5, 6:
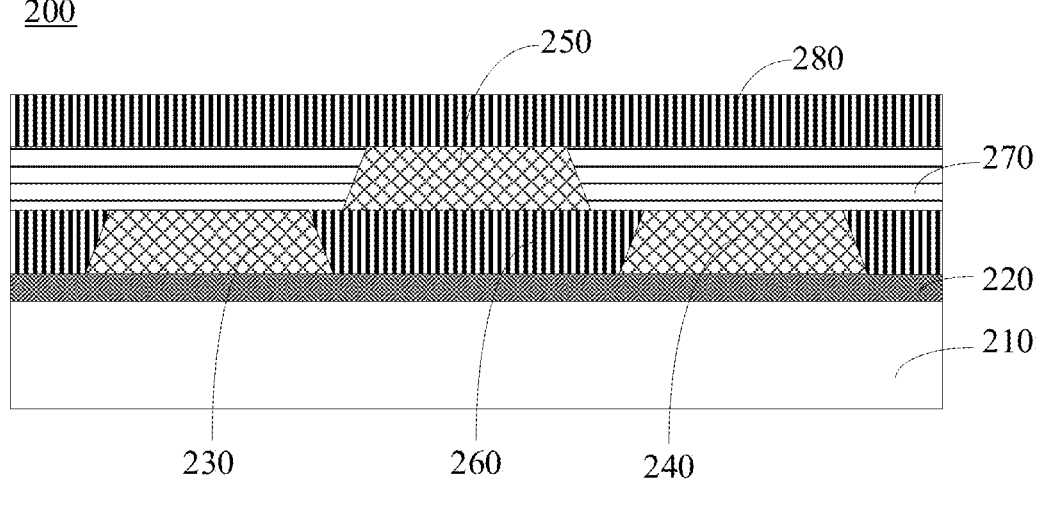
FIG. 5 is a schematic diagram of a third structure of an array substrate provided by the embodiment of the present application.
FIG. 6 is a schematic diagram of a fourth structure of an array substrate provided by an embodiment of the present application.

Please refer to FIG. 3 and FIG. 5. FIG. 5 is a schematic diagram of a third structure of an array substrate provided by an embodiment of the present application. Wherein, the first planarization layer 260 may be disposed on the same layer as the first light-shielding layer 230 and the second light-shielding layer 240 on the conductive thin film layer 220. The sum of the orthographic projection areas of the first light-shielding layer 230, the second light-shielding layer 240, and the first planarization layer 260 on the substrate 210 may be smaller than or equal to the orthographic projection area of the conductive thin film layer 220 on the substrate 210. It can be understood that the first planarization layer 260 is disposed corresponding to the third light-shielding layer 250, which can block the electrical connection between the third light-shielding layer 250 and the conductive thin film layer 220 to prevent short circuits from occurring. Therefore, if the first planarization layer 260 is provided at the position corresponding to the third light-shielding layer 250, the sum of the orthographic projection areas of the first light-shielding layer 230, the second light-shielding layer 240, and the first planarization layer 260 on the substrate 210 is smaller than the orthographic projection area of the conductive thin film layer 220 on the substrate 210. In addition, there are other metal wirings arranged on the layer where the first light-shielding layer 230, the second light-shielding layer 240, and the third light-shielding layer 250 are arranged. In order to prevent the conductive thin film layer 220 from being in direct contact with the metal wiring and short-circuiting, the first planarization layer 260 may be provided in other remaining regions of the same layer as the first light-shielding layer 230 and the second light-shielding layer 240. Then the sum of the orthographic projection areas of the first light-shielding layer 230, the second light-shielding layer 240, and the first planarization layer 260 on the substrate 210 is equal to the orthographic projection area of the conductive thin film layer 220 on the substrate 210 so that the first planarization layer 260 exerts a good insulating effect and further improves the quality of the product.

Please continue to refer to FIG. 3 and FIG. 5. The base substrate 200 may further include a gate insulating layer 270 and a second planarization layer 280, wherein the gate insulating layer 270 may be disposed on the conductive thin film layer 220, and the gate insulating layer 270 covers the first light-shielding layer 230, the second light-shielding layer 240, the third light-shielding layer 250, and the first planarization layer 260. The second planarization layer 280 may be disposed on the gate insulating layer 270.

Please refer to FIG. 6. FIG. 6 is a schematic diagram of a fourth structure of an array substrate provided by an embodiment of the present application. Wherein, in order to prevent the third light-shielding layer 250 from directly contacting the conductive thin film layer 220 and causing a short circuit, a groove 50 may be defined on a side of the conductive thin film layer 220 away from the substrate 210. The orthographic projection area of the third light-shielding layer 250 on the substrate 210 is positioned in the orthographic projection area of the groove 50 on the substrate 210 so that the third light-shielding layer and the conductive film layer are spaced apart by the groove to prevent short circuit. It can be understood that an insulating material can be filled in the groove 50 to support the third light-shielding layer 250 to ensure that the third light-shielding layer 250 can be disposed in the area corresponding to the groove 50.

It should be noted that the first light-shielding layer 230 and the second light-shielding layer 240 may be disposed on both sides of the third light-shielding layer 250, respectively. That is, the third light-shielding layer 250 is disposed between the first light-shielding layer 230 and the second light-shielding layer 240, then the groove 50 defined on the conductive thin film layer 220 is also disposed between the first light-shielding layer 230 and the second light-shielding layer 240. However, in order to realize the electrical connection between the first light-shielding layer 230 and the second light-shielding layer 240 through the conductive thin film layer 220, the depth of the groove 50 needs to be less than the thickness of the conductive thin film layer 220. Therefore, it is ensured that at least a part of the conductive thin film layer 220 is provided at the position corresponding to the groove 50 to realize the electrical connection between the first light-shielding layer 230 and the second light-shielding layer 240.

As mentioned above, in this embodiment, the electrical connection between the first light-shielding layer 230 and the second light-shielding layer 240 is not realized by metal wiring. Instead, the electrical connection between the first light-shielding layer 230 and the second light-shielding layer 240 is achieved through the direct contact between the first light-shielding layer 230/second light-shielding layer 240 and the conductive film layer 220. The conductive thin film layer 220 is not in the same layer as the first light-shielding layer 230 and the second light-shielding layer 240. Therefore, the short-circuit problem caused by the excessive crossing of the first light-shielding layer 230 and the second light-shielding layer 240 with the metal wiring controlling other signals in the same layer is prevented, thereby improving product quality.

In addition, by directly electrically connecting the first light-shielding layers 230 and the second light-shielding layers 240 corresponding to the plurality of pixel units in the array substrate 200 with the conductive thin film layer 220, the metal wirings led by the two for connecting with multiple external chips are reduced, thereby reducing the output signal. Furthermore, by disposing the first planarization layer 260 between the third light-shielding layer 250 and the conductive thin film layer 220 or defining a groove 50 on the conductive thin film layer 220 to block the electrical connection therebetween, the short circuit between the third light-shielding layer 250 and the conductive thin film layer 220 is prevented, and the product quality is further improved.

Correspondingly, the embodiments of the present application further provide a manufacturing method of an array substrate. Please refer to FIG. 7, which is a schematic flowchart of a manufacturing method of an array substrate provided by an embodiment of the present application. The manufacturing method of the array substrate may include the following steps:

Step 301, providing a substrate. In this embodiment, the substrate 210 may be a glass substrate or the like.

Step 302, forming a conductive thin film layer on the substrate.

The conductive thin film layer 220 may be formed on substrate 210 by means of deposition. Specifically, the conductive thin film layer 220 may be integrally formed on substrate 210, that is, the area of the conductive thin film layer 220 is the same as that of the substrate 210. The conductive thin film layer 220 can be made of conductive materials, such as indium tin oxide, etc, so the conductive thin film layer 220 can be served as a common electrode, and the conductive thin film layer 220 can form an integral common electrode on the substrate 210. The conductive thin film layer 220 may be connected to a common voltage input terminal positioned in the peripheral region of the array substrate 200 so that the conductive thin film layer 220 obtains a common voltage.

Step 303, forming a first light-shielding layer, a second light-shielding layer, and a third light-shielding layer on a side of the conductive thin film layer away from the substrate.

Wherein an orthographic projection area of the first light-shielding layer and an orthographic projection area of the second light-shielding layer on the substrate are positioned in an orthographic projection area of the conductive thin film layer on the substrate, and wherein the first light-shielding layer and the second light-shielding layer include conductor materials. The first light-shielding layer 230, the second light-shielding layer 240, and the third light-shielding layer 250 can be formed on the side of the conductive thin film layer 220 away from the substrate 210 by deposition. Furthermore, the first light-shielding layer 230 and the second light-shielding layer 240 can be formed by the same process. Specifically, the first light-shielding layer 230 and the second light-shielding layer 240 corresponding to each pixel unit in the array substrate 200 can also be manufactured by the same process, thereby reducing the number of manufacturing processes.

The first light-shielding layer 230 and the second light-shielding layer 240 are both conductor materials. The first light-shielding layer 230 and the second light-shielding layer 240 are both attached to the conductive film layer 220, and the orthographic projection regions of the first light-shielding layer 230 and the second light-shielding layer 240 on substrate 210 are positioned in the orthographic projection region of the conductive thin film layer 220 on substrate 210. In addition, the first light-shielding layer 230 and the second light-shielding layer 240 are both conductive materials, and they are electrically connected to the conductive film layer 220. Because the first light-shielding layer 230 and the second light-shielding layer 240 are in direct contact with the conductive thin film layer 220, the electrical connection between them and the conductive film layer 220 can be achieved without setting metal wiring between them and the conductive film layer 220. Thus, the electrical connection between the first light-shielding layer 230 and the second light-shielding layer 240 is realized through the conductive thin film layer 220.

It should be noted that the array substrate 200 includes an array device layer. The array device layer includes a plurality of pixel units, and each pixel unit may include three thin film transistors, which are a first thin film transistor, a second thin film transistor and a third thin film transistor, respectively. In order to shield each thin film transistor from light, a light-shielding layer is correspondingly disposed under each thin film transistor. Specifically, the first thin film transistor and the first light-shielding layer 230 are correspondingly arranged, the first light-shielding layer 230 is positioned between the substrate 210 and the first thin film transistor, and the first light-shielding layer 230 shields the first thin film transistor from light. The second thin film transistor and the second light-shielding layer 240 are arranged correspondingly, the second light-shielding layer 240 is positioned between the substrate 210 and the second thin film transistor, and the second light-shielding layer 240 shields the second thin film transistor from light. The third thin film transistor and the third light-shielding layer 250 are arranged correspondingly, the third light-shielding layer 250 is positioned between the substrate 210 and the third thin film transistor, and the third light-shielding layer 250 shields the third thin film transistor from light.

It should be noted that the array device layer of the array substrate 200 includes a plurality of pixel units, and each pixel unit includes a first thin film transistor, a second thin film transistor, and a third thin film transistor. In order to shield the thin film transistors from light, the three thin film transistors of each pixel unit need to be respectively provided with a first light-shielding layer 230, a second light-shielding layer 240, and a third light-shielding layer 250, respectively. That is, a plurality of first light-shielding layers 230, a plurality of second light-shielding layers 240, and a plurality of third light-shielding layers 250 are correspondingly provided in the plurality of pixel units, and a first light-shielding layer 230 and a second light-shielding layer 240 corresponding to a pixel unit are electrically connected through the conductive thin film layer 220.

A first light-shielding layer 130 and a second light-shielding layer 140 corresponding to a pixel unit in the array substrate 100 provided by the prior art are led out and connected to an external chip through metal wirings connected to the two. This causes the connection between the two and multiple chips to have multiple lead-out metal wirings, thereby increasing the output signal of the array substrate 100. In this embodiment, the conductive thin film layer 220 is integrally disposed on the substrate 210, so that it can be electrically connected to a plurality of external chips. The plurality of first light-shielding layers 230 and the plurality of second light-shielding layers 240 in the array substrate 200 are directly and electrically connected to the conductive thin film layer 220. Therefore, there is no need to lead out metal wirings between the plurality of first light-shielding layers 230 and the plurality of second light-shielding layers 240 to be connected to the plurality of chips. By connecting with the conductive thin film layer 220, the plurality of thin film transistors in the array substrate 200 can control the signals of the plurality of chips, thereby reducing the lead-out metal wiring, reducing the output signal, and improving the quality of the product.

In addition, a first planarization layer 260 may also be formed on the conductive thin film layer 220. Specifically, the first planarization layer 260 may be disposed between the conductive thin film layer 220 and the third light-shielding layer 250, that is, the third light-shielding layer 250 may be formed on the first planarization layer 260 by means of deposition, and the first planarization layer 260 is an insulating material. It should be noted that the third light-shielding layer 250 corresponds to the third thin film transistor, that is, the third light-shielding layer 250 shields the third thin film transistor from light. The third thin film transistor can be a driving thin film transistor, and the driving thin film transistor is used for connecting with the light-emitting device in the pixel unit to emit light. Therefore, the third light-shielding layer 250 needs to be connected to the source of the third thin film transistor to obtain a given voltage of the light-emitting device. Because the conductive thin film layer 220 has conductivity, if the third light-shielding layer 250 is in direct contact with the conductive thin film layer 220, and if the given voltage obtained by the third light-shielding layer 250 is the same as the common voltage obtained by the conductive thin film layer 220, it is easy to cause a short circuit.

In order to prevent the occurrence of a short circuit between the third light-shielding layer 250 and the conductive thin film layer 220, the orthographic projection area of the third light-shielding layer 250 on substrate 210 may be set within the orthographic projection area of the first planarization layer 260 on the substrate 210. Therefore, the first planarization layer 260 with insulating properties can play a role in blocking the electrical connection between the third light-shielding layer 250 and the thin film layer 220.

Please refer to FIG. 3 and FIG. 5, wherein the first planarization layer 260 may be disposed on the same layer as the first light-shielding layer 230 and the second light-shielding layer 240 on the conductive thin film layer 220. The sum of the orthographic projection areas of the first light-shielding layer 230, the second light-shielding layer 240, and the first planarization layer 260 on the substrate 210 may be less than or equal to the orthographic projection area of the conductive thin film layer 220 on the substrate 210. It can be understood that the first planarization layer 260 is disposed corresponding to the third light-shielding layer 250, which can block the electrical connection between the third light-shielding layer 250 and the conductive thin film layer 220 and avoid the occurrence of short circuits. Therefore, by disposing the first planarization layer 260 at the position corresponding to the third light-shielding layer 250, then the sum of the orthographic projection areas of the first light-shielding layer 230, the second light-shielding layer 240, and the first planarization layer 260 on the substrate 210 is smaller than the orthographic projection area of the conductive thin film layer 220 on the substrate 210. In addition, other metal wirings are arranged on the same layers of the first light-shielding layer 230, the second light-shielding layer 240, and the third light-shielding layer 250. In order to prevent a short circuit due to direct contact between the conductive thin film layer 220 and other metal wirings, a first planarization layer 260 may be provided in other remaining areas of the same layer as the first light-shielding layer 230 and the second light-shielding layer 240, then, the sum of the orthographic projection areas of the first light-shielding layer 230, the second light-shielding layer 240, and the first planarization layer 260 on the substrate 210 is equal to the orthographic projection area of the conductive thin film layer 220 on the substrate 210. Therefore, the first planarization layer 260 plays a good insulating role and further improves the quality of the product.

In addition, a gate insulating layer 270 is formed on the conductive thin film layer 220 by deposition, wherein the gate insulating layer 270 covers the first light-shielding layer 230, the second light-shielding layer 240, the third light-shielding layer 250, and the first planarization layer 260. A second planarization layer 280 is formed on the gate insulating layer 270 by means of deposition.

Please continue to refer to FIG. 6, in order to avoid a short circuit caused by the direct contact between the third light-shielding layer 250 and the conductive film layer 220, a groove 50 may be provided on the side of the conductive film layer 220 away from the substrate 210. The orthographic projection area of the third light-shielding layer 250 on substrate 210 is positioned in the orthographic projection area of the groove 50 on substrate 210 so that the third light-shielding layer 250 and the conductive thin film layer 220 are spaced apart by the groove 50 to avoid short circuit. It can be understood that an insulating material can be filled in groove 50 to support the third light-shielding layer 250 through the insulating material to ensure that the third light-shielding layer 250 can be disposed in the area corresponding to groove 50.

It should be noted that the first light-shielding layer 230 and the second light-shielding layer 240 may be respectively disposed on both sides of the third light-shielding layer 250, that is, the third light-shielding layer 250 is disposed between the first light-shielding layer 230 and the second light-shielding layer 240. Then, the groove 50 defined on the conductive thin film layer 220 is also arranged between the first light-shielding layer 230 and the second light-shielding layer 240. However, in order to realize the electrical connection between the first light-shielding layer 230 and the second light-shielding layer 240 through the conductive thin film layer 220, the depth of the groove 50 needs to be smaller than the thickness of the conductive thin film layer 220. Therefore, it is ensured that at least a part of the conductive thin film layer 220 is provided at the position corresponding to groove 50 to realize the electrical connection between the first light-shielding layer 230 and the second light-shielding layer 240.

Step 304, forming an array device layer on the first light-shielding layer, the second light-shielding layer, and the third light-shielding layer.

One pixel unit in the array device layer of the array substrate 200 includes a first thin film transistor, a second thin film transistor, and a third thin film transistor, wherein the first light-shielding layer 230 is positioned between the substrate 210 and the first thin film transistor, the second light-shielding layer 240 is positioned between the substrate 210 and the second thin film transistor, and the third light-shielding layer 250 is positioned between the substrate 210 and the third thin film transistor.

As described above, in the embodiments of the present application, a substrate is provided, a conductive thin film layer is formed on the substrate, and a first light-shielding layer, a second light-shielding layer, and a third light-shielding layer are formed on the side of the conductive thin film layer away from the substrate, and an array device layer is formed on the first light-shielding layer, the second light-shielding layer, and the third light-shielding layer. In this embodiment, metal wirings are not used between the first light-shielding layer 230 and the second light-shielding layer 240 to achieve an electrical connection between the two. Instead, the direct contact between the first light-shielding layer 230 and the second light-shielding layer 240, and the conductive film layer 220 is used to realize the electrical connection between them. The conductive thin film layer 220 is not in the same layer as the first light-shielding layer 230 and the second light-shielding layer 240. This avoids the short-circuit problem caused by the first light-shielding layer 230 and the second light-shielding layer 240 being connected by metal wirings in the same layer and intersecting with metal wirings controlling other signals in the same layer, thereby improving product quality.

Furthermore, by directly and electrically connecting the first light-shielding layers 230 and the second light-shielding layers 240 provided in the array substrate 200 corresponding to the pixel units with the conductive thin film layer 220, the metal wirings led out from the two to connect with multiple external chips are reduced, thereby reducing the output signal. In addition, by arranging the first planarization layer 260 between the third light-shielding layer 250 and the conductive thin film layer 220 or defining the groove 50 on the conductive thin film layer 220 to block the electrical connection between the two, the short circuit between the third light-shielding layer 250 and the conductive thin film layer 220 is avoided, and the product quality is further improved.

Embodiments of the present application further provide a display panel 1000, where the display panel 1000 includes the array substrate provided in the foregoing embodiments. The display panel 1000 may be a full-screen display panel, for example, the display panel 1000 may be a wearable device such as a watch, a wristband, or the like, or the display panel 1000 may be an electronic device such as a mobile phone or a tablet computer. Alternatively, the display panel 1000 may be a product or component with a display function, such as a television, a monitor, a notebook computer, a digital photo frame, or a navigator.

In the aforesaid embodiments, the description of each embodiment has its own emphasis. For parts that are not described in detail in a certain embodiment, reference may be made to the relevant descriptions of other embodiments.

The array substrate, the manufacturing method thereof, and the display panel provided by the embodiments of the present application have been introduced in detail above. The principles and implementations of the present application are described herein using specific examples, and the descriptions of the above embodiments are only used to help understand the methods and core ideas of the present application. Meanwhile, for one skill in the art, according to the idea of the present application, there will be changes in the specific embodiments and the scope of application. In conclusion, the content of this specification should not be construed as a limitation on this application.

What is claimed is:

1. An array substrate, comprising:

a substrate;

a conductive thin film layer disposed on the substrate;

a first light-shielding layer, a second light-shielding layer, and a third light-shielding layer, wherein the first light-shielding layer, the second light-shielding layer, and the third light-shielding layer are disposed on a side of the conductive thin film layer away from the substrate, wherein an orthographic projection area of the first light-shielding layer and an orthographic projection area of the second light-shielding layer on the substrate are positioned in an orthographic projection area of the conductive thin film layer on the substrate, wherein the first light-shielding layer and the second light-shielding layer are directly and electrically connected to the conductive thin film layer, and wherein the first light-shielding layer and the second light-shielding layer comprise conductor materials; and an array device layer, wherein a pixel unit of the array device layer comprises a first thin film transistor, a second thin film transistor, and a third thin film transistor, and wherein the first light-shielding layer is positioned between the substrate and the first thin film transistor, the second light-shielding layer is positioned between the substrate and the second thin film transistor, and the third light-shielding layer is positioned between the substrate and the third thin film transistor;

wherein in a stacking direction of layers, the conductive thin film layer and the third light shielding layer are arranged to be spaced apart and insulated from each other.

2. The array substrate of claim 1, wherein a first planarization layer is arranged on a same layer as the first light-shielding layer and the second light-shielding layer on the conductive thin film layer, and wherein a sum of the orthographic projection area of the first light-shielding layer, the orthographic projection area of the second light-shielding layer, and the orthographic projection area of the first planarization layer on the substrate is less than or equal to the orthographic projection area of the conductive thin film layer on the substrate.

3. The array substrate of claim 2, further comprising a gate insulating layer, and a second planarization layer, wherein the gate insulating layer is disposed on the conductive thin film layer, the gate insulating layer covers the first light-shielding layer, the second light-shielding layer, the third light-shielding layer, and the first planarization layer, and the second planarization layer is disposed on the gate insulating layer.

4. The array substrate of claim 1, wherein a groove is defined on a side of the conductive thin film layer away from the substrate, and wherein an orthographic projection area of the third light-shielding layer on the substrate is positioned in an orthographic projection area of the groove on the substrate.

5. The array substrate of claim 4, wherein a depth of the groove is less than a thickness of the conductive thin film layer.

6. The array substrate of claim 1, wherein a material of the conductive thin film layer comprises indium tin oxide.

7. The array substrate of claim 1, further comprising a first planarization layer arranged between the conductive thin film layer and the third light-shielding layer, wherein an orthographic projection area of the third light-shielding layer on the substrate is positioned in an orthographic projection area of the first planarization layer on the substrate.

8. A method of manufacturing an array substrate, comprising:

providing a substrate;

forming a conductive thin film layer on the substrate;

forming a first light-shielding layer, a second light-shielding layer, and a third light-shielding layer on a side of the conductive thin film layer away from the substrate, wherein an orthographic projection area of the first light-shielding layer and an orthographic projection area of the second light-shielding layer on the substrate are positioned in an orthographic projection area of the conductive thin film layer on the substrate, wherein the first light-shielding layer and the second light-shielding layer are directly and electrically connected to the conductive thin film layer, and wherein the first light-shielding layer and the second light-shielding layer comprise conductor materials;

forming an array device layer on the first light-shielding layer, the second light-shielding layer, and the third light-shielding layer, wherein a pixel unit of the array device layer comprises a first thin film transistor, a second thin film transistor, and a third thin film transistor, and wherein the first light-shielding layer is positioned between the substrate and the first thin film transistor, the second light-shielding layer is positioned between the substrate and the second thin film transistor, and the third light-shielding layer is positioned between the substrate and the third thin film transistor; and in a stacking direction of layers, arranging the conductive thin film layer and the third light shielding layer to be spaced apart and insulated from each other.

9. The method of manufacturing the array substrate of claim 8, wherein after forming the first light-shielding layer, the second light-shielding layer, and the third light-shielding layer on the side of the conductive thin film layer away from the substrate, the method further comprises:

forming a gate insulating layer on the conductive thin film layer, forming a first planarization layer on the conductive thin film layer, wherein the gate insulating layer covers the first light-shielding layer, the second light-shielding layer, the third light-shielding layer, and the first planarization layer; and forming a second planarization layer on the gate insulating layer.

10. The method of manufacturing the array substrate of claim 8, wherein a first planarization layer is arranged on a same layer as the first light-shielding layer and the second light-shielding layer on the conductive thin film layer, wherein a sum of the orthographic projection area of the first light-shielding layer, the orthographic projection area of the second light-shielding layer, and the orthographic projection area of the first planarization layer on the substrate is less than or equal to the orthographic projection area of the conductive thin film layer on the substrate.

11. The method of manufacturing the array substrate of claim 8, wherein a groove is defined on a side of the conductive thin film layer away from the substrate, and wherein an orthographic projection area of the third light-shielding layer on the substrate is positioned in an orthographic projection area of the groove on the substrate.

12. The method of manufacturing the array substrate of claim 11, wherein a depth of the groove is less than a thickness of the conductive thin film layer.

13. The method of manufacturing the array substrate of claim 8, wherein a material of the conductive thin film layer comprises indium tin oxide.

14. The method of manufacturing the array substrate of claim 8, further comprising:

forming a first planarization layer on the conductive thin film layer, wherein the first planarization layer is arranged between the conductive thin film layer and the third light-shielding layer, and wherein an orthographic projection area of the third light-shielding layer on the substrate is positioned in an orthographic projection area of the first planarization layer on the substrate.

15. A display panel, comprising an array substrate, and the array substrate comprising:

a substrate;

a conductive thin film layer disposed on the substrate;

a first light-shielding layer, a second light-shielding layer, and a third light-shielding layer, wherein the first light-shielding layer, the second light-shielding layer, and the third light-shielding layer are disposed on a side of the conductive thin film layer away from the substrate, wherein an orthographic projection area of the first light-shielding layer and an orthographic projection area of the second light-shielding layer on the substrate are positioned in an orthographic projection area of the conductive thin film layer on the substrate, wherein the first light-shielding layer and the second light-shielding layer are directly and electrically connected to the conductive thin film layer, and wherein the first light-shielding layer and the second light-shielding layer comprise conductor materials; and an array device layer, wherein a pixel unit of the array device layer comprises a first thin film transistor, a second thin film transistor, and a third thin film transistor, and wherein the first light-shielding layer is positioned between the substrate and the first thin film transistor, the second light-shielding layer is positioned between the substrate and the second thin film transistor, and the third light-shielding layer is positioned between the substrate and the third thin film transistor;

wherein in a stacking direction of layers, the conductive thin film layer and the third light shielding layer are arranged to be spaced apart and insulated from each other.

16. The display panel of claim 15, wherein a first planarization layer is arranged on a same layer as the first light-shielding layer and the second light-shielding layer on the conductive thin film layer, and wherein a sum of the orthographic projection area of the first light-shielding layer, the orthographic projection area of the second light-shielding layer, and the orthographic projection area of the first planarization layer on the substrate is less than or equal to the orthographic projection area of the conductive thin film layer on the substrate.

17. The display panel of claim 16, further comprising a gate insulating layer, and a second planarization layer, wherein the gate insulating layer is disposed on the conductive thin film layer, the gate insulating layer covers the first light-shielding layer, the second light-shielding layer, the third light-shielding layer, and the first planarization layer, and the second planarization layer is disposed on the gate insulating layer.

18. The display panel of claim 15, wherein a groove is defined on a side of the conductive thin film layer away from the substrate, and wherein an orthographic projection area of the third light-shielding layer on the substrate is positioned in an orthographic projection area of the groove on the substrate.

19. The display panel of claim 18, wherein a depth of the groove is less than a thickness of the conductive thin film layer.

20. The display panel of claim 15, wherein a material of the conductive thin film layer comprises indium tin oxide.

\* \* \* \* \*